US011374099B2

(12) United States Patent
Liao et al.

(10) Patent No.: US 11,374,099 B2
(45) Date of Patent: Jun. 28, 2022

(54) 3D MEMORY DEVICE INCLUDING SOURCE LINE STRUCTURE COMPRISING COMPOSITE MATERIAL

(71) Applicant: MACRONIX INTERNATIONAL CO., LTD., Hsinchu (TW)

(72) Inventors: Ting-Feng Liao, Hsinchu (TW); Sheng-Hong Chen, Kaohsiung (TW); Kuang-Wen Liu, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 16/930,505

(22) Filed: Jul. 16, 2020

(65) Prior Publication Data

US 2022/0020856 A1 Jan. 20, 2022

(51) Int. Cl.
| | | |
|---|---|---|
| H01L 29/417 | (2006.01) | |
| H01L 21/768 | (2006.01) | |
| H01L 23/535 | (2006.01) | |
| H01L 27/11582 | (2017.01) | |

(52) U.S. Cl.
CPC .. *H01L 29/41741* (2013.01); *H01L 21/76804* (2013.01); *H01L 21/76843* (2013.01); *H01L 21/76877* (2013.01); *H01L 23/535* (2013.01); *H01L 27/11582* (2013.01)

(58) Field of Classification Search
CPC ......... H01L 21/76804; H01L 21/76843; H01L 21/76877; H01L 23/535; H01L 27/11582; H01L 29/41741
See application file for complete search history.

(56) References Cited

U.S. PATENT DOCUMENTS

| | | | |
|---|---|---|---|
| 5,814,862 A | 9/1998 | Sung et al. | |
| 9,305,934 B1* | 4/2016 | Ding | H01L 27/1157 |
| 10,147,732 B1* | 12/2018 | Hu | H01L 27/11524 |
| 10,283,513 B1* | 5/2019 | Zhou | H01L 27/11582 |
| 2017/0236836 A1* | 8/2017 | Huo | H01L 28/00 257/324 |
| 2018/0261621 A1* | 9/2018 | Chen | H01L 27/11582 |
| 2018/0294273 A1* | 10/2018 | Liao | H01L 27/11582 |
| 2018/0358370 A1* | 12/2018 | Hwang | H01L 27/11582 |
| 2019/0214402 A1* | 7/2019 | Lin | H01L 27/1157 |

FOREIGN PATENT DOCUMENTS

CN 109585454 A 4/2019

OTHER PUBLICATIONS

TW Office Action dated Dec. 9, 2021 in Taiwan application No. 109124040.

* cited by examiner

*Primary Examiner* — Herve-Louis Y Assouman
(74) *Attorney, Agent, or Firm* — McClure, Qualey & Rodack, LLP

(57) ABSTRACT

A semiconductor structure and a method for manufacturing the same are provided. The semiconductor structure includes a source line structure. The source line structure includes a composite material formed in a trench. The composite material includes an oxide portion and a metal portion.

18 Claims, 5 Drawing Sheets

3D MEMORY DEVICE INCLUDING SOURCE LINE STRUCTURE COMPRISING COMPOSITE MATERIAL

BACKGROUND

Technical Field

The disclosure relates to a semiconductor structure and a method for manufacturing the same, and more particularly to a semiconductor structure with a source line structure including a composite material.

Description of the Related Art

A source line structure in a semiconductor structure in the art is usually formed by polysilicon or metal materials, e.g. tungsten (W). Such source line structure suffers from several problems, such as unstable isolation problems caused by fluorine gases inherent in the metal materials and dislocation problems caused by stress.

Fluorine gases are released from the source line structure to a layer formed above the source line structure, e.g. a cap layer, and erode the layer above the source line structure to form pits in the layer. The pits formed in the layer above the source line structure affect undesirably the isolation of the source line structure. In addition, stress may exist in a manufacturing process of the source line structure. Stress may result in a bending source line structure, sloping memory cell groups, and dislocation problems in a back-end of line (BEOL) process. For example, a dislocation problem may include a misalignment between a via and the source line structure when forming the via on the source line structure.

It is desirable to provide technology for a semiconductor structure having a source line structure with improved isolation property and reduced dislocation defect, but still with good conductivity as well.

SUMMARY

The present disclosure relates to a semiconductor structure and a method for manufacturing the same.

According to an embodiment, a semiconductor structure is provided. The semiconductor structure comprises a source line structure. The source line structure comprises a composite material formed in a trench. The composite material comprises an oxide portion and a metal portion.

According to another embodiment, a method for manufacturing a semiconductor structure is provided. The method comprises: forming a trench in a stack structure; and forming a composite material in the trench to form a source line structure. The step of forming the composite material in the trench comprises: forming an oxide portion in the trench, and forming a metal portion in the trench.

The above and other embodiments of the disclosure will become better understood with regard to the following detailed description of the non-limiting embodiment(s). The following description is made with reference to the accompanying drawings.

DETAILED DESCRIPTION

The embodiment of the present disclosure can be implemented in several different semiconductor structures in the applications. For example, the embodiment can be applied to, but not limited to, the three-dimensional (3D) vertical-channel type memory devices. Further, the embodiment of the present disclosure can be applied to 3D Integrated circuit (IC) structures. The embodiment is provided hereinafter with reference to the accompanying drawings for elaborating one of the semiconductor structures and a method for manufacturing the same.

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
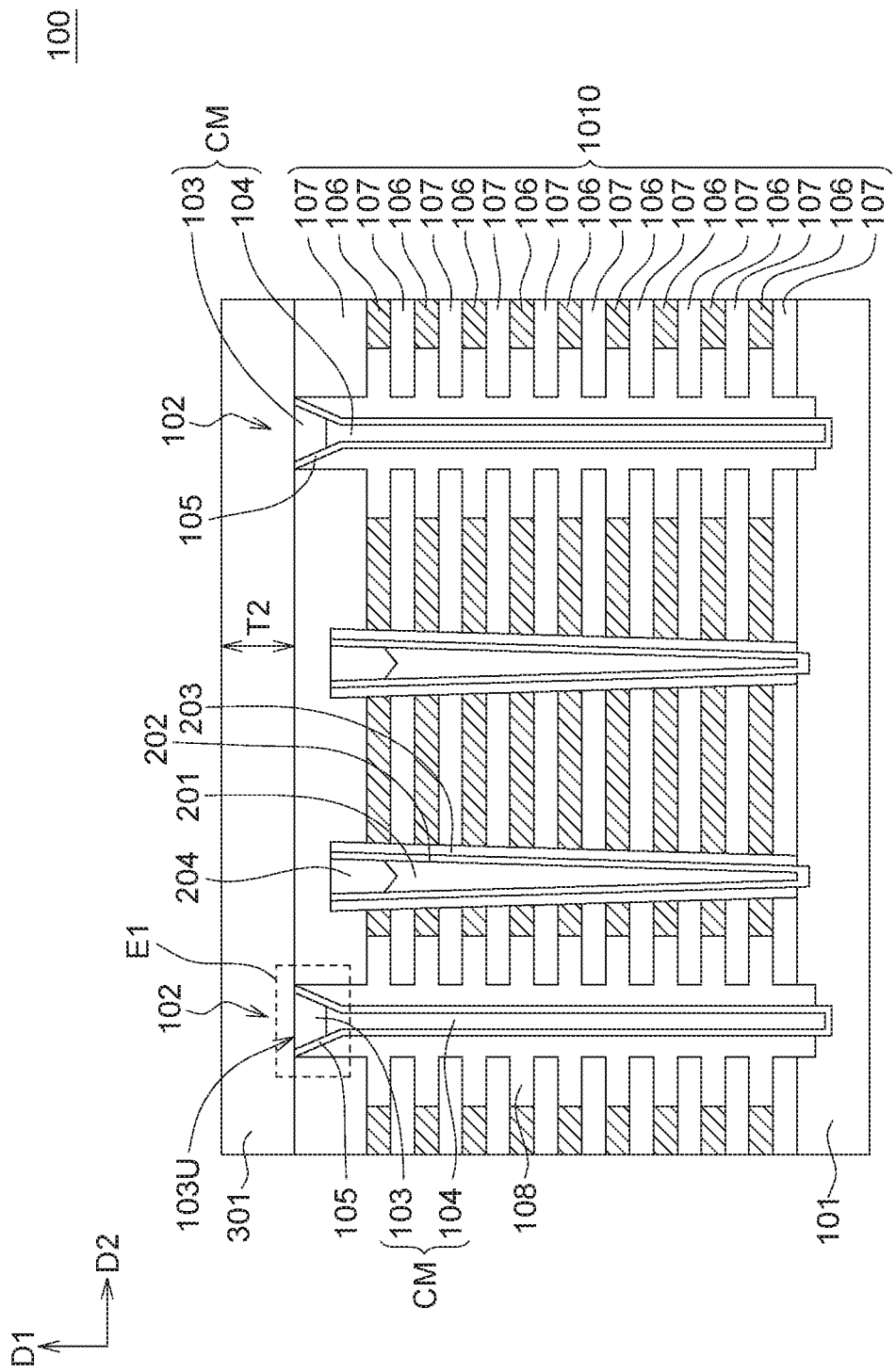
FIG. 1 is a cross-sectional view for simply illustrating a semiconductor structure according to an embodiment of the present disclosure.
Figure 2:
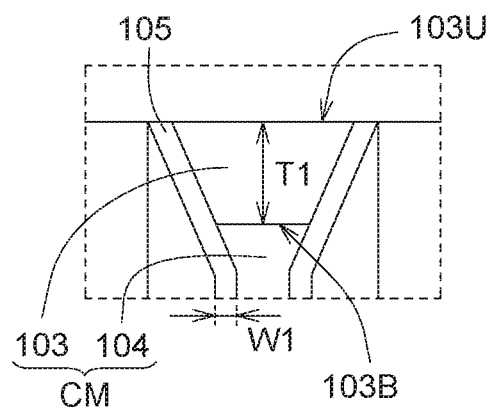
FIG. 2 is a drawing of partial enlargement for simply illustrating a semiconductor structure according to an embodiment of the present disclosure.

FIG. 1 is a cross-sectional view for simply illustrating a semiconductor structure 100 according to an embodiment of the present disclosure. FIG. 2 is a drawing of partial enlargement for simply illustrating a semiconductor structure 100 according to an embodiment of the present disclosure, particularly an enlarged drawing of portion E1 of FIG. 1.

Please refer to FIGS. 1 and 2 at the same time. In an embodiment, a semiconductor structure 100 includes a source line structure. For example, the source line structure may be a common source line. The source line structure includes a composite material CM formed in a trench 102. The composite material CM includes an oxide portion 104 and a metal portion 103.

In an embodiment, the semiconductor structure 100 may include a stack structure 1010 disposed on a substrate 101. In an embodiment, the substrate 101 may include silicon (Si). The stack structure 1010 may include a plurality of conductive layers 106 and a plurality of insulating layers 107 stacked alternately. The conductive layers 106 are separated from each other by the insulating layers 107, In an embodiment, the insulating layers 107 may include oxide. In an embodiment, the conductive layers 106 may be gate structures. In an embodiment, the conductive layers 106 may include a conductive material. In an embodiment, the conductive layers 106 may be tungsten (W) or polysilicon materials. The semiconductor structure 100 may include an oxide layer 108. The oxide layer 108 extends through the stack structure 1010 along a first direction D1 and contacts the substrate 101. A trench 102 extends along the first direction D1. A portion of the substrate 101 is exposed by the trench 102.

In an embodiment, the semiconductor structure 100 may include a barrier element 105 formed in the trench 102. Specifically, the barrier element 105 is formed on a sidewall and a bottom surface of the trench 102. Specifically, the barrier element 105 is disposed between the composite material CM and the oxide layer 108. The barrier element 105 may have a width W1 (depicted in FIG. 2) in a range of about 20-40 angstroms (Å).

In an embodiment, the oxide portion 104 of the composite material CM fills a lower portion of the trench 102, and the metal portion 103 of the composite material CM fills an upper portion of the trench 102. The terms "lower portion" and "upper portion" used herein refer to relative positions in the trench 102. Specifically, the "upper portion" refers to a portion of the trench 102 far away from the substrate 101 compared with a portion indicated by the "lower portion".

The metal portion 103 of the composite material CM has an upper surface 103U and a bottom surface 103B opposite to the upper surface 103U. The "upper surface 103U" used herein refers to a surface of the metal portion 103 far away from the substrate 101 compared with a surface indicated by the "bottom surface 103B". In an embodiment, the upper surface 103U may, but not limit to, have an area larger than an area which the bottom surface 103B has. For example, the metal portion 103 tapers from the upper surface 103U to the bottom surface 103B. In an embodiment, the oxide portion 104 is formed below the metal portion 103 and directly contacts the metal portion 103 at the bottom surface 103B of the metal portion 103.

In an embodiment, the oxide portion 104 may include oxide. Specifically, the oxide portion 104 may include a low temperature oxide (LTO). For example, the low temperature oxide may include silicon oxide formed at about 300° C., or TEOS (tetraethoxysilane) formed at 600° C. In an embodiment, the metal portion 103 may include metal, preferably tungsten. In an embodiment, the metal portion 103 may have a thickness T1 (depicted in FIG. 2) less than 2000 angstroms. In an embodiment, the thickness T1 of the metal portion 103 is in a range of 1350-1650 angstroms (i.e. 1500±10% angstroms).

Moreover, the semiconductor structure 100 further includes a vertical channel structure passing through the stack structure 1010. The vertical channel structure includes a channel layer 202, a memory layer 203, a dielectric film 201 and a pad 204. The memory layer 203 is disposed on an outer sidewall of the channel layer 202. The dielectric film 201 is disposed on an inner sidewall and a bottom surface of the channel layer 202. The pad 204 is disposed on the dielectric film 201.

Figure 3A:
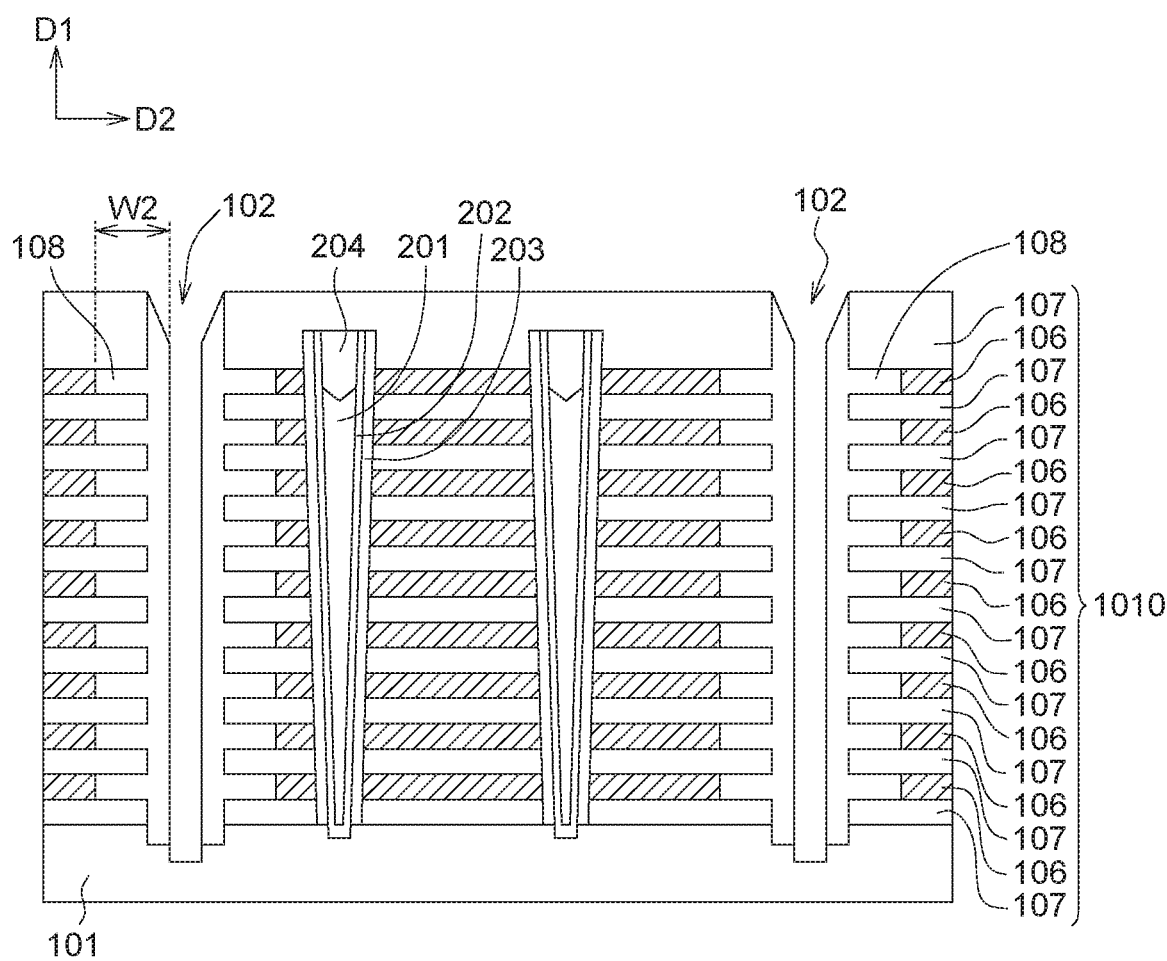
FIGS. 3A-3E schematically illustrate a method for manufacturing a semiconductor structure according to an embodiment of the present disclosure.

FIGS. 3A-3E schematically illustrate a method for manufacturing a semiconductor structure according to an embodiment of the present disclosure. As shown in FIG. 3A, a substrate 101 is provided. A stack structure 1010 is formed over the substrate 101. The stack structure 1010 may include a plurality of conductive layers 106 and a plurality of insulating layers 107 stacked alternately on the substrate 101 along a first direction D1. The conductive layers 106 are separated from each other by the insulating layers 107. In an embodiment, the conductive layers 106 may be gate structures. A vertical channel structure passes through the stack structure 1010. The vertical channel structure includes a channel layer 202, a memory layer 203, a dielectric film 201 and a pad 204. The memory layer 203 is disposed on an outer sidewall of the channel layer 202. The dielectric film 201 is disposed on an inner sidewall and a bottom surface of the channel layer 202. The pad 204 is disposed on the dielectric film 201. In an embodiment, the substrate 101 may include a Si substrate, the insulating layers 107 may include silicon oxide. The conductive layers 106 may include a conductive material, such as a conductor material or a semiconductor material. The semiconductor material may include polysilicon, such as doped polysilicon. The memory layer 203 may include an ONO structure, an ONONO structure, an ONONONO structure, or a SiON/SiN/oxide structure. The channel layer 202 may include a semiconductor material, such as a doped semiconductor material or an undoped semiconductor material. In an embodiment, the channel layer 202 may include polysilicon, such as a doped polysilicon or an undoped polysilicon.

As shown in FIG. 3A, an oxide layer 108 passes through the stack structure 1010. In an embodiment, the oxide layer 108 is formed by a deposition process, such as a chemical vapor deposition (CVD) process. In an embodiment, the oxide layer 108 may include a low temperature oxide (LTO). A trench 102 is formed by removing part of the oxide layer 108. That is to say, the trench 102 is formed in the stack structure 1010. In other words, the trench 102 is formed in the oxide layer 108. In an embodiment, the trench 102 is formed by etching the oxide layer 108 and stopping the etching process until a surface of the substrate 101 is exposed. In an embodiment, the oxide layer 108 may have a width W2 extending along a second direction D2 of about 500 angstroms after the formation of the trench 102. For example, the first direction D1 is perpendicular to the second direction D2. In an embodiment, the trench 102 may have an opening, a top of the opening has a width along the second direction D2 larger than a width of a bottom surface along the second direction D2 of the trench. For example, the upper end of the oxide layer 108 may have an oblique angle after the formation of the trench 102. For example, the upper end of the oxide layer 108 may tapper to a point along a direction away from the substrate 101 so as to make the opening of the trench 102 gradually broader along the direction away from the substrate 101.

Figure 3B:
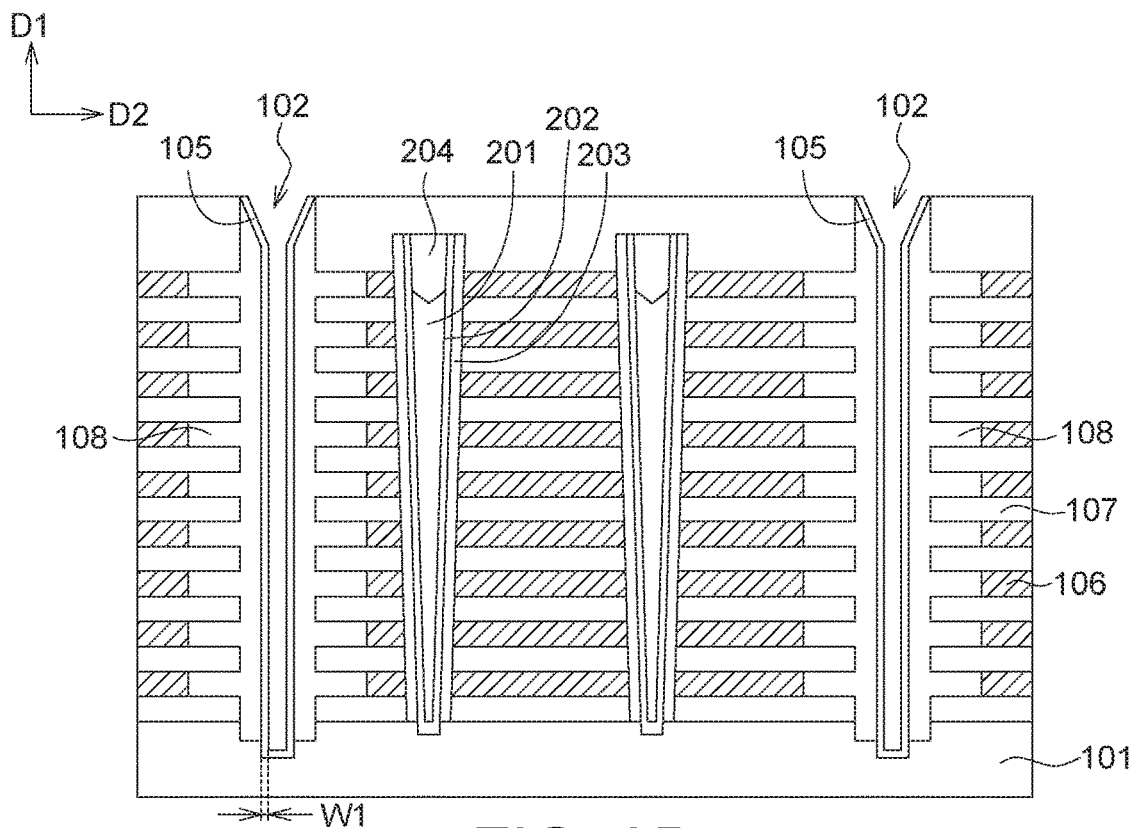

Then, as show in FIG. 3B, a barrier element 105 is formed on a sidewall and the bottom surface of the trench 102 by a deposition process. In an embodiment, the barrier element 105 may include titanium (Ti). In an embodiment, the barrier element 105 may include titanium nitride (TiN) or a combination of titanium and titanium nitride. In an embodiment, the barrier element 105 may have a width W1 in a range of about 15-45 angstroms. In an embodiment, the barrier element 105 may have a width W1 of about 30 angstroms.

Figure 3C:
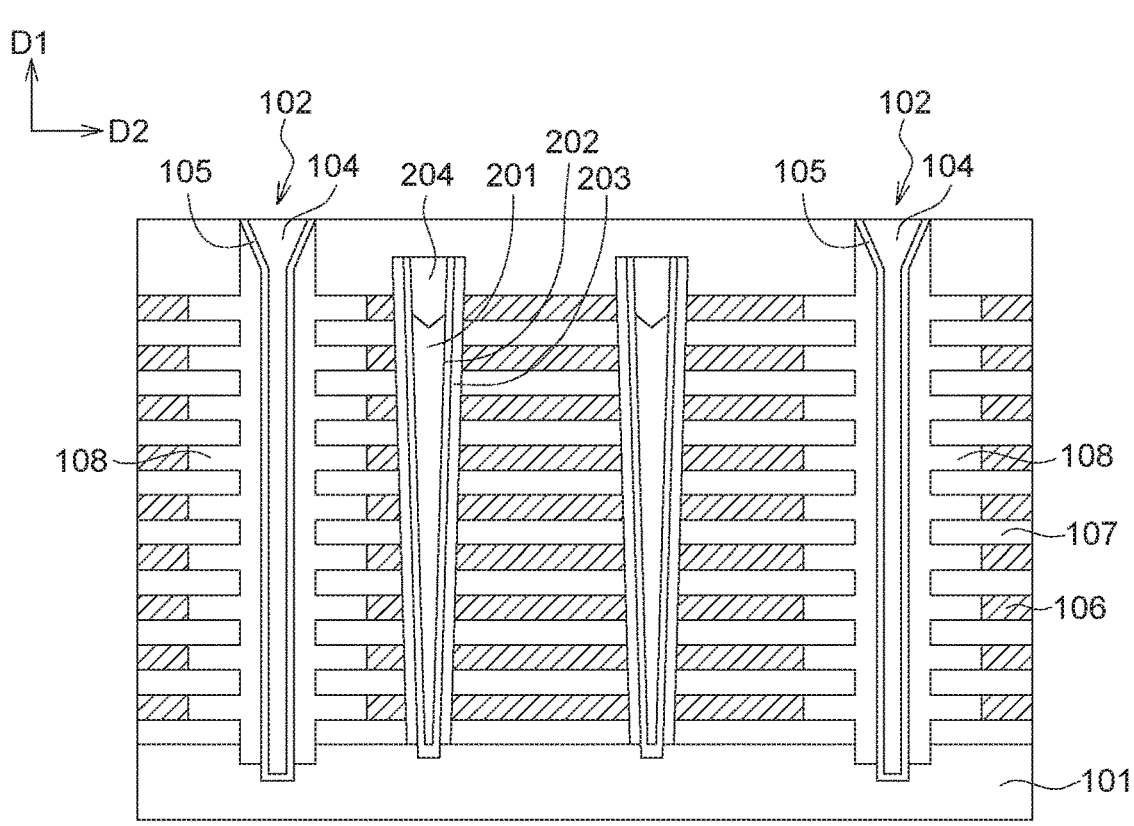
Figure 3D:
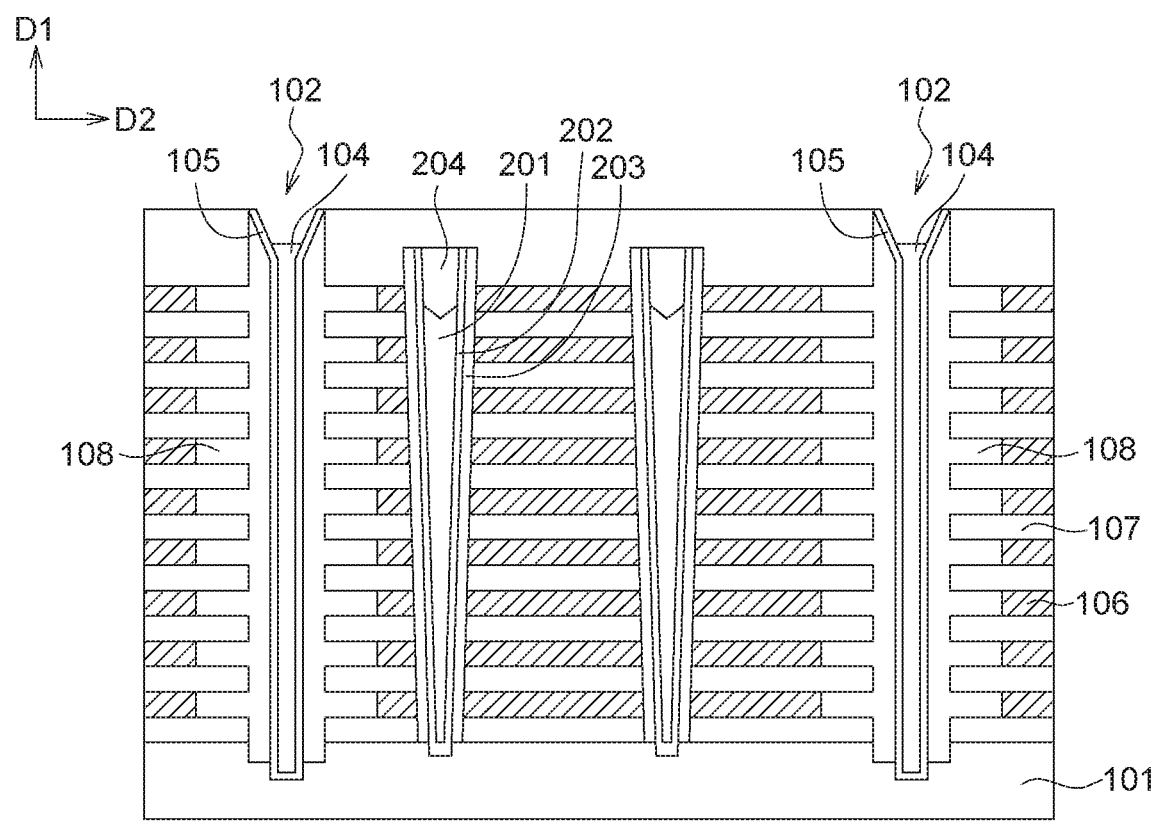
Figure 3E:
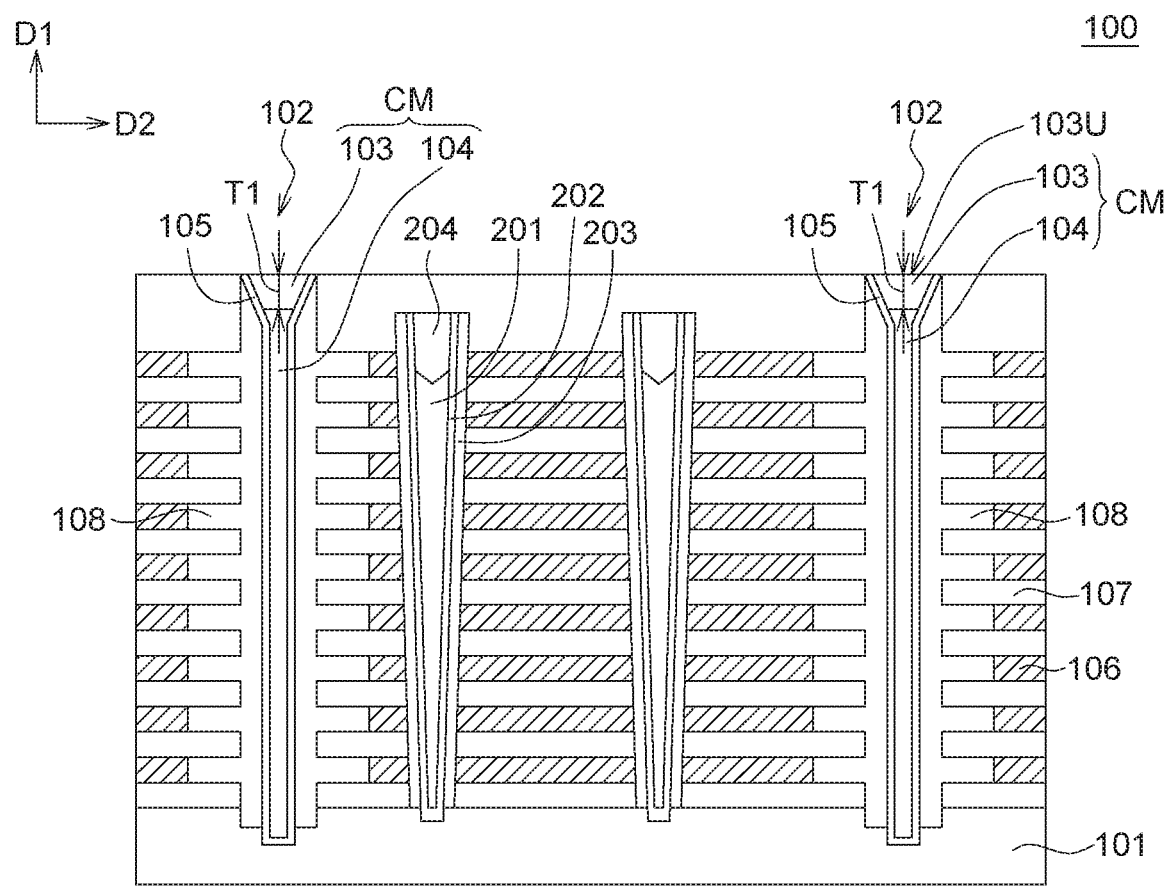

FIGS. 3C-3E schematically illustrate forming a composite material CM including an oxide portion 104 and a metal portion 103 in the trench 102. As shown in FIG. 3C, the trench 102 is filled with an oxide portion 104 by a deposition process. The oxide portion 104 is then etched back so as to make an upper surface of the oxide portion 104 lower than a top surface of the stack structure 1010, as shown in FIG. 3D, In an embodiment, the oxide portion 104 may include low temperature oxide, and low temperature oxide may be formed by a low temperature oxidation process. For example, the oxide portion 104 may include low temperature silicon oxide, and low temperature silicon oxide may be formed by applying an oxidation process to a material including silicon at 300-450° C.

Then, as shown in FIG. 3E, a metal portion 103 is formed in the trench 102 by a deposition process. That is, the metal portion is formed on the oxide portion For example, forming the metal portion 103 may include: depositing a material of the metal portion 103 on the stack structure 1010 and the oxide portion 104; removing a portion of the material of the metal portion 103 to expose the top surface of the stack structure 1010 and make the top surface of the stack structure 1010 and the upper surface 103U of the metal portion 103 coplanar. The material of the metal portion 103 may be tungsten. In an embodiment, a planarization process may be applied to the semiconductor structure 100. The planarization process may be a chemical-mechanical planarization (CMP) process. In an embodiment, the resulting metal portion 103 has a thickness T1 of about 1500 angstroms.

A profile of the metal portion 103 may depend on the shape of the trench 102 and the oxide portion 104 formed in the trench 102. For example, the metal portion 103 may have an upper surface 103U and a bottom surface 103B opposite to the upper surface 103U (as depicted in FIG. 2), and the upper surface 103U has an area larger than an area which the bottom surface 103B has. In an embodiment, the metal portion 103 tapers from the upper surface 103U to the bottom surface 103B. In other embodiments; the transition in the area of the metal portion 103 from its maximum area to its minimum area is abrupt or immediate, rather than gradual.

The metal portion 103 may be formed on the oxide portion 104 directly. As such, the oxide portion 104 directly contacts the metal portion 103 at the bottom surface 103B (as depicted in FIGS. 1-2) of the metal portion 103. In an embodiment, the barrier element 105 may surround the metal portion 103 and the oxide portion 104, and the barrier element 105 may directly contact the metal portion 103, the oxide portion 104 and the substrate 101. The barrier element 105 may be electrically connect to the metal portion 103 and the substrate 101.

Then, referring back to FIG. 1, in an embodiment, the semiconductor structure 100 may further include a dielectric layer 301 (ILD2). The dielectric layer 301 (ILD2) may be formed on the stack structure 1010 and covering the upper surface 103U of the metal portion 103 by a deposition process, as shown in FIG. 1. The dielectric layer 301 may include oxide. The dielectric layer 301 may have a thickness T2 of about 3400 angstroms.

The present disclosure uses the source line structure including the composite material to replace a source line structure including only metal, such as tungsten. Due to decreased amount of metal material in the source line structure, the pits formed by fluorine gases, released from the metal material in the source line structure, is decreased, and the isolation property of the semiconductor structure is improved. Further, the use of the composite material in the source line structure also helps to reduce the impact of the stress on the semiconductor structure as compared with the use of single material, such as polysilicon or tungsten, in the source line structure. In other words, the semiconductor structure of the present disclosure helps to improve the sloping profile of the semiconductor structure, solve the dislocation problems in the semiconductor structure and avoid circuit bridge problems caused by the dislocation problems.

When applying a bias voltage to the source line structure of the present disclosure, source line current flows though the metal portion and the barrier element to achieve electrical connection. The source line current of the source line structure of the present disclosure displays characteristics similar to the source line current of the source line structure including only tungsten under the same test condition. Furthermore, ion performances of string current of the semiconductor structure of the present disclosure and the semiconductor structure in the art (e.g. the semiconductor structure with a source line structure including only tungsten) are similar. The string current flows through the vertical channel structures and would be affected by the source line structure. Therefore, even with a decreased amount of metal material in the source line structure of the present disclosure, the semiconductor structure of the present disclosure still has good conductivity.

According to an embodiment of the present disclosure, semiconductor structure is provided. The semiconductor structure includes a source line structure. The source line structure includes a composite material formed in a trench, and the composite material includes an oxide portion and a metal portion. As compared with a conventional source line structure only including metal (e.g. a source line structure including only tungsten), the source line structure of the semiconductor of the present disclosure includes the composite material (including the oxide portion) so as to decrease the amount of metal material in the source line structure. As such, fluorine gases released from the metal material in the source line structure is decreased, the pits formed by fluorine gases are also decreased, and the isolation property of the semiconductor structure is improved. Further, according to the present disclosure, the use of the composite material in the source line structure also helps to reduce the impact of the stress on the semiconductor structure as compared with the use of single material, such as polysilicon or tungsten, in the source line structure. In other words, the semiconductor structure of the present disclosure helps to improve the sloping profile of the semiconductor structure, solve the dislocation problems in the semiconductor structure and avoid circuit bridge problems caused by the dislocation problems.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a semiconductor structure, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A semiconductor structure, comprising:
   a source line structure comprising a composite material formed in a trench; and
   a barrier element,
   wherein the composite material comprising:
      an oxide portion; and
      a metal portion,
   wherein the barrier element is on outer sidewalls of the metal portion and the oxide portion and on a bottom surface of the oxide portion, the barrier element is electrically connected to the metal portion.
2. The semiconductor structure according to claim 1, wherein the metal portion has an upper surface and a bottom surface opposite to the upper surface, the upper surface has an area larger than an area which the bottom surface has.

3. The semiconductor structure according to claim 2, wherein the oxide portion is formed below the metal portion and directly contacts the metal portion at the bottom surface of the metal portion.

4. The semiconductor structure according to claim 2, wherein the metal portion tapers from the upper surface to the bottom surface.

5. The semiconductor structure according to claim 1, wherein the metal portion has a thickness less than 2000 angstroms (Å).

6. The semiconductor structure according to claim 5, wherein the thickness of the metal portion is between 1400 angstroms and 1600 angstroms.

7. The semiconductor structure according to claim 1, further comprising a vertical channel structure.

8. The semiconductor structure according to claim 1, wherein the barrier element has a width between 20 angstroms and 40 angstroms, and comprises titanium (Ti).

9. The semiconductor structure according to claim 1, wherein the oxide portion comprises low-temperature oxide (LTO).

10. A method for manufacturing a semiconductor structure, comprising:
    forming a trench in a stack structure;
    forming a composite material in the trench to form a source line structure, comprising:
    forming an oxide portion in the trench; and
    forming a metal portion in the trench; and
    forming a barrier element between a sidewall of the trench and the composite material, wherein the barrier element is on outer sidewalls of the metal portion and the oxide portion and on a bottom surface of the oxide portion, the barrier element is electrically connected to the metal portion.

11. The method according to claim 10, wherein in the step of forming the metal portion in the trench, the metal portion has an upper surface and a bottom surface opposite to the upper surface, the upper surface has an area larger than an area which the bottom surface has.

12. The method according to claim 11, further comprising:
    forming the metal portion on the oxide portion, wherein the oxide portion directly contacts the metal portion at the bottom surface of the metal portion.

13. The method according to claim 10, wherein in the step of forming the metal portion in the trench, the metal portion tapers from an upper surface to a bottom surface.

14. The method according to claim 10, wherein the metal portion formed in the trench has a thickness less than 2000 angstroms.

15. The method according to claim 14, wherein the thickness of the metal portion is between 1400 angstroms and 1600 angstroms.

16. The method according to claim 10, wherein the barrier element comprises titanium (Ti), the barrier element has a width between 20 angstroms and 40 angstroms.

17. The method according to claim 10, wherein the step of forming the trench in the stack structure further comprises:
    forming an oxide layer passing through the stack structure; and
    etching the oxide layer to form the trench, wherein the trench exposes a surface of a substrate.

18. The method according to claim 17, further comprising forming a vertical channel structure passing through the stack structure.

* * * * *